United States Patent
Druilhe et al.

(10) Patent No.: US 7,486,582 B2
(45) Date of Patent: Feb. 3, 2009

(54) DYNAMIC MEMORY FOR A CELLULAR TERMINAL

(75) Inventors: François Druilhe, Le Versoud (FR); Andrew Cofler, La Murette (FR); Denis Dutoit, Fontanil-Cornillon (FR); Michel Harrand, Saint Egreve (FR); Gilles Eyzat, Claix (FR); Christian Freund, Jarrie (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/346,796

(22) Filed: Feb. 3, 2006

(65) Prior Publication Data

US 2006/0176748 A1    Aug. 10, 2006

(30) Foreign Application Priority Data

Feb. 4, 2005    (FR)    .................................... 05 50338

(51) Int. Cl.
*G11C 7/00*    (2006.01)

(52) U.S. Cl. ........................... 365/222; 365/14; 365/229

(58) Field of Classification Search ................. 365/222, 365/14, 229, 233.019
See application file for complete search history.

(56) References Cited

U.S. PATENT DOCUMENTS

| 4,313,180 | A | 1/1982 | Mochizuki et al. |
| 5,313,428 | A | 5/1994 | Inoue |
| 5,703,823 | A | 12/1997 | Douse et al. |
| 6,323,721 | B1 * | 11/2001 | Proebsting ................. 327/535 |
| 6,542,959 | B2 * | 4/2003 | Tabo ........................... 711/106 |
| 2004/0148523 | A1 * | 7/2004 | Lambert ...................... 713/201 |
| 2004/0202038 | A1 * | 10/2004 | Li ............................... 365/233 |

* cited by examiner

*Primary Examiner*—Hoai V Ho
*Assistant Examiner*—Jason Lappas
(74) *Attorney, Agent, or Firm*—Lisa K. Jorgenson; James H. Morris; Wolf, Greenfield & Sacks, P.C.

(57) ABSTRACT

A DRAM and its application to a mobile telephony circuit with a control circuit including a first refreshment controller controlled by a first clock signal and a second refreshment controller controlled by a second clock signal having a frequency less than that of the first one and used to synchronize events of the GSM network.

11 Claims, 3 Drawing Sheets

DYNAMIC MEMORY FOR A CELLULAR TERMINAL

BACKGROUND OF THE INVENTION

1. Field of the Invention

The present invention generally relates to dynamic memories (DRAMs) which are volatile memories requiring refreshment of the cells to maintain the information that they contain. The present invention more specifically applies to battery-supplied mobile systems, for example, cell phones or cellular terminals of 3G/EGPRS/GSM type.

2. Discussion of the Related Art

DRAMs are generally formed of an array of memory cells with which are associated addressing and input/output circuits as well as a refreshment circuit. The refreshment circuit is used to periodically address all the memory cells to preserve the information that they contain.

In a cell phone application, such DRAMs are generally used in circuits (screen, camera, GSM—A-GPS assisted satellite position finding system, . . . ) peripheral to the basic telephony circuit (modem).

FIG. 1 is a schematic block diagram illustrating a conventional embodiment of a simplified architecture of the digital circuits of a GSM-type cell phone. For simplification, only the digital circuits have been shown, although the telephone of course comprises radio-frequency transceiver circuits to communicate with the GSM network and its stations.

The main element of the telephone is a digital baseband processor (DBP) circuit 1 forming the telephony circuit and comprising the modulation-demodulation elements necessary for communications with the GSM network. Inside of the telephone, circuit 1 is connected by one or several data exchange, address, and control and supply signal buses 2 to the other mobile phone elements. Among the circuits connected to buses 2, there is a power management circuit 3 (PW), application circuits 8 (CAMERA), for example, for a video or photographic camera, satellite position finding circuits 9 (A-GPS), a unit 10 (for example, an arithmetical and logic unit—UART) of asynchronous communication with the outside (for example, with a PC), and different memories, for example, a non-volatile memory (ROM), a DRAM 5, a flash-type memory 6 (FLASH), and a SRAM 7. Other components are present in the telephone, especially to manage the elements of keyboard type, etc.

The present invention more specifically applies to circuit 1 forming the telephony circuit which, unlike the other application circuits contained in the telephone, must keep on operating in stand-by mode of the mobile phone, especially to periodically communicate with the GSM network and be woken up on reception of an incoming call.

FIG. 2 very schematically shows in the form of blocks an example of a conventional architecture of telephony circuit 1 of a GSM terminal. All the elements illustrated in FIG. 2 are integrated on a same chip.

Circuit 1 essentially comprises:

an external memory controller 11 for communicating with bus 2;

a microprocessor 12 (ARM926EJ-S Core) associated with two cache memory elements 13 (I Cache) and 14 (D Cache);

a circuit 15 (ARM peripherals and Modem) containing peripherals of the microprocessor as well as a modem for communicating with analog radio-frequency transceiver circuits (not shown);

a SRAM 18;

a boot ROM; and an internal bus system 16 (AMBA bus system) dedicated to microprocessor 12 and to which are especially connected circuits 11, 12, 13, 14, 15, 17, and 18.

Most often, a telephony circuit also comprises:

a signal processor (DSP) 21 (ST122 Core) associated with an SRAM-type data memory 22;

a program memory extension circuit 23 comprising a ROM circuit 24 (Program ROM) for containing programs dedicated to processor 21, an SRAM circuit 25 (Patch RAM) for containing updates of these programs during the circuit lifetime, and a cache memory circuit 26 dedicated to processor 21; and a bus management system 20 (DSP bus system) to which are connected the circuits dedicated to processor 21 and which is itself connected to main bus 16.

For simplification, the different connections between the elements inside of circuit 1 have not been shown and only the connection to buses 2 from controller 11 has been illustrated.

The operation of such a telephony circuit is known and does not need to be further detailed for the discussion of the present invention.

Conventional telephony circuits suffer from several disadvantages linked to the used memory circuits. In particular, on the side of signal processor 21, the use of a ROM 24 to contain the programs adversely affects the flexibility of the signal processor and the necessary updates of its content.

It has already been devised to replace this memory with flash memory, but flash memories have the disadvantage of not being programmable on the fly, that is, by communications with the GSM network to modify applications in the telephone lifetime.

As for SRAMs, they pose problems of size and power consumption during their operation. It is accordingly conventionally attempted to minimize the size of circuits 18 and 25 which are SRAMs.

The use of SRAMs or ROMs is linked to their non-volatile character generating no power consumption to keep the information in stand-by periods of the telephone.

On the size of microprocessor 12, the presence of an SRAM circuit 18 adversely affects the system size and power consumption.

Further, the capacities of the memories required by mobile phones and more generally GSM terminals become greater and greater. This capacity increase conventionally performed by means of SRAMs is not desirable.

Such problems are essentially present for telephony circuit 1. Indeed, the other GSM terminal circuits are less sensitive since they are not active in stand-by periods of the telephone.

The use of DRAMs would be a solution. However, such memories are volatile and require permanent refreshment to preserve the information that they contain. They thus have been discarded up to now due to the large power consumption required by such a refreshment.

FIG. 3 schematically shows in the form of blocks an example of a conventional architecture of a DRAM circuit 40. Such a circuit essentially comprises an array network 41 (MEM ARRAY) of memory cells connected by input/output circuits 42 (I/O DRIVERS) to an input data bus 43 (DATA IN) and to an output data bus 44 (DATA OUT). Circuit 40 comprises a address bus input 45 (ADD) connected, by a selection multiplexer 55, to a control interface 46 (CTRL INTERF). A second input of the multiplexer receives addresses automatically generated by a refreshment controller 48 (NRC) periodically generating all the addresses of network 41 to preserve the information that they contain. Circuit 48 receives a clock signal CKIN from the outside of circuit 40 which is also directly sent to control interface 46. Selector 55 is controlled by a signal originating from a control circuit not shown of the memory. Interface 46 provides addresses to an address decoder 47 (ADD ROW DEC) for selecting the addressed memory cells in network 41 and to a precharge of the bit lines. Finally, circuit 40 integrates a linear regulator 49 receiving a supply voltage Vdd from the outside and providing a regulated supply voltage Vc, among others, to one of the electrodes (in practice, the common electrode) of all the capacitive elements of network 41. For simplification, FIG. 4 only shows the elements and connections useful for the refreshment. Memory 40 of course comprises other circuits used for the data transfer and the user mode as well as a general control circuit. Further, circuit 40 may exchange other signals with the outside, for example, over a control bus.

The architecture of FIG. 4 for example corresponds to that of memory 5 (FIG. 1).

The integration of a memory such as illustrated in FIG. 3 in a telephony circuit is incompatible with the low power consumption needs of this circuit in standby period.

Indeed, when the mobile phone is at standby, the telephone processor only operates with limited functions and under a reduced supply voltage. These limited functions especially are the periodic interrogation of the base stations of the GSM network to detect a possible incoming call as well as a circuit waking function by the user himself. At standby, the internal circuits of generation of a high-frequency clock (several tens of MHz) for the operation of the processors and the refreshment of the DRAMs (signal CKIN) are deactivated.

Now, the memory cell refreshment requires on the one hand a clock frequency and on the other hand a sufficient supply voltage. The greater the memory capacity, the higher the clock frequency must be to enable a refreshment compatible with the cell retention capacity. Typically, the retention time of a DRAM is of several tens of milliseconds.

Another difficulty is that the supply voltage provided to the telephony circuit is different in the standby mode and in the active mode. Typically, in GSM-type telephony circuits, this voltage falls from on the order of 1.2 volt in operation to approximately 0.95 volt at standby.

Such constraints result in that conventional DRAMs are unadapted.

SUMMARY OF THE INVENTION

The present invention aims at overcoming all or part of the disadvantages of integrated memories in conventional telephony circuits.

The present invention more specifically aims at providing a DRAM usable in GSM-type mobile telephony circuits.

The present invention also aims at making the power consumption of a DRAM compatible with a mobile telephone standby operation.

The present invention further aims at providing a solution adaptable to different memory capacities.

To achieve all or part of these objects, as well as others, the present invention provides a circuit for controlling a DRAM, comprising a first refreshment controller controlled by a first clock signal, and a second refreshment controller controlled by a second clock signal having a lower frequency than the first one.

According to an embodiment of the present invention, the first refreshment circuit is activated in normal operation mode while the second refreshment circuit is activated in standby mode of the circuit integrating the DRAM.

According to an embodiment of the present invention, the second clock frequency synchronizes the operation mode switchings.

According to an embodiment of the present invention, at least two voltage regulators are respectively dedicated to the normal and standby operation modes.

The present invention also provides a DRAM comprising an array network of memory cells and a control circuit.

The present invention also provides a mobile telephony circuit comprising at least one microprocessor and its peripherals and modems, and integrating at least one first DRAM.

According to an embodiment of the present invention, the second clock frequency corresponds to the synchronization frequency of events of the GSM network.

According to an embodiment of the present invention, the telephony circuit further integrates a signal processor.

According to an embodiment of the present invention, the signal processor is associated with a second DRAM.

The present invention also provides a mobile phone comprising a telephony circuit.

The foregoing and other objects, features, and advantages of the present invention will be discussed in detail in the following non-limiting description of specific embodiments in connection with the accompanying drawings.

DETAILED DESCRIPTION

Figure 1:
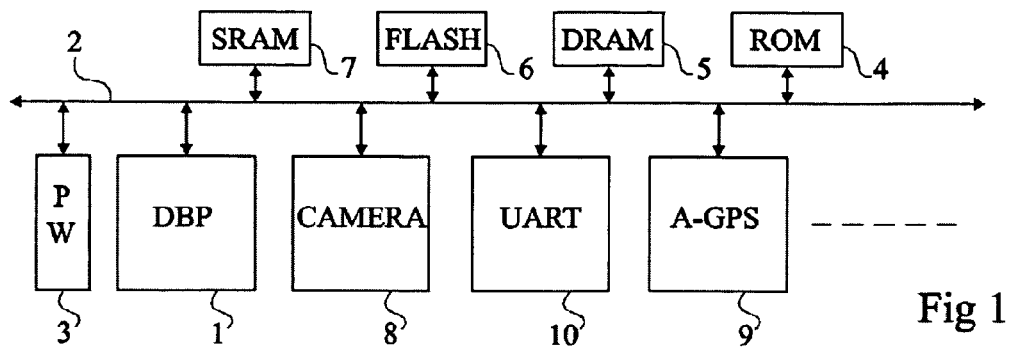
FIG. 1, previously described, partially and very schematically shows in the form of blocks an example of the conventional architecture of a mobile phone of the type to which the present invention more specifically applies.

The same elements have been designated with the same reference numerals in the different drawings which have been drawn out of scale. For clarity, only those elements which are necessary to the understanding of the present invention have been shown in the drawings and will be described hereafter. In particular, the details constitutive of a GSM terminal have not been discussed, the present invention being compatible with any conventional GSM terminal. Further, the internal structure of a DRAM memory plane has not been described in detail, the implementation of the present invention being here again compatible with conventional structures.

The present invention will be described hereafter in relation with an application to the integration, in a telephony circuit, of a DRAM. It however more generally applies to the forming of a DRAM, the power consumption of which adapts to different operation phases, and to its use in any application requiring these different operation modes.

Figure 3:
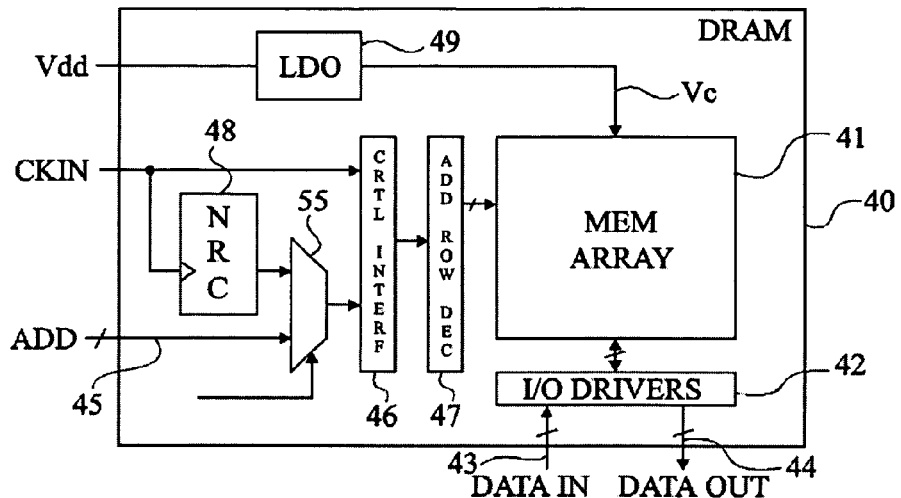
FIG. 3, previously described, partially and schematically shows in the form of blocks an example of a conventional DRAM architecture.

FIG. 3 very schematically shows in the form of blocks an embodiment of a telephony circuit 1' (digital baseband processor) forming a digital baseband processor.

As previously, this circuit integrates a microprocessor 12 (ARM926EJ-S Core) associated with two memories 13 (I Cache) and 14 (D Cache), with a ROM 17 (Boot ROM) containing the boot programs, and with a peripheral and modem circuit 15 (ARM Peripherals and Modem). Microprocessor 12 communicates over an internal bus 16 (AMBA bus system) with these different elements as well as with an external memory controller 11 (Ext. Memory Controller), itself connected to main bus 2 (FIG. 1) of the GSM terminal. Bus 16 further communicates with a second bus 20 (DSP bus system) dedicated in this example to an optional signal processor 21 (ST122 Core). Processor 21 is, as previously, associated with an SRAM-type static data memory 22 as well as with a program memory extension circuit 23' comprising, among others, a cache memory 26 (Program Cache).

Figure 2:
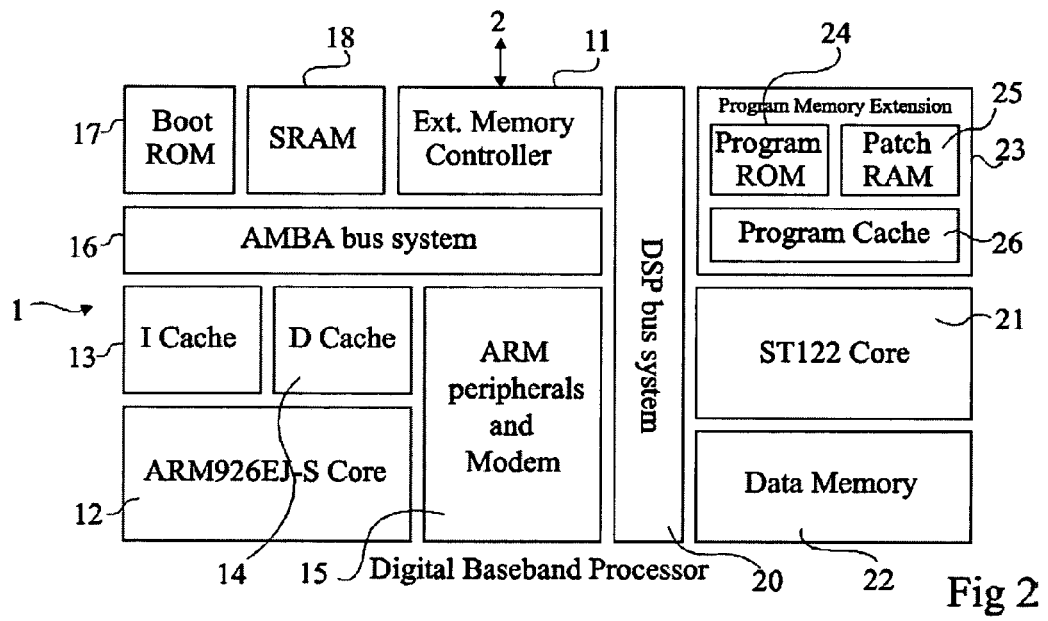
FIG. 2, previously described, very schematically shows in the form of blocks an example of the conventional architecture of a telephony circuit of the type to which the present invention applies.
Figure 4:
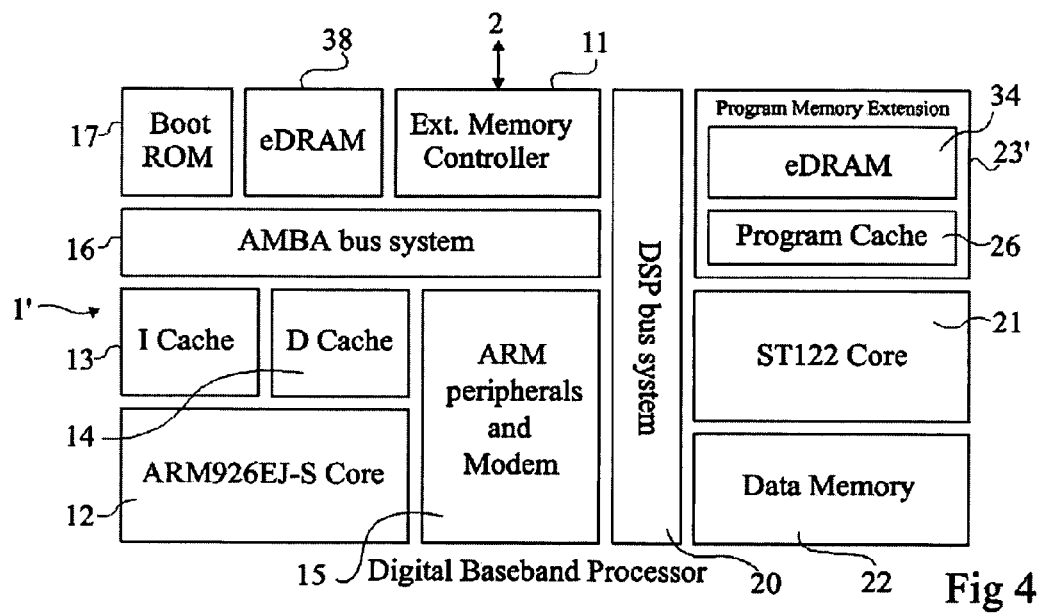
FIG. 4 very schematically shows in the form of blocks an embodiment of a telephony circuit according to the present invention.

According to this embodiment of the present invention, circuit 1' also comprises a DRAM integrated with the other elements. In the shown example, a first circuit 38 (eDRAM) is associated with main microprocessor 12 by being connected to bus system 16, while a second circuit 34 is associated with signal processor 21 by being comprised in program memory extension circuit 23'. Circuit 38 replaces static memory 18 and circuit 34 replaces at least circuit 24 and preferentially circuits 24 and 25 of the conventional architecture of FIG. 2.

The present invention provides integrating DRAMs with a telephony circuit and making these memories non-volatile by an appropriate refreshment.

Figure 5:
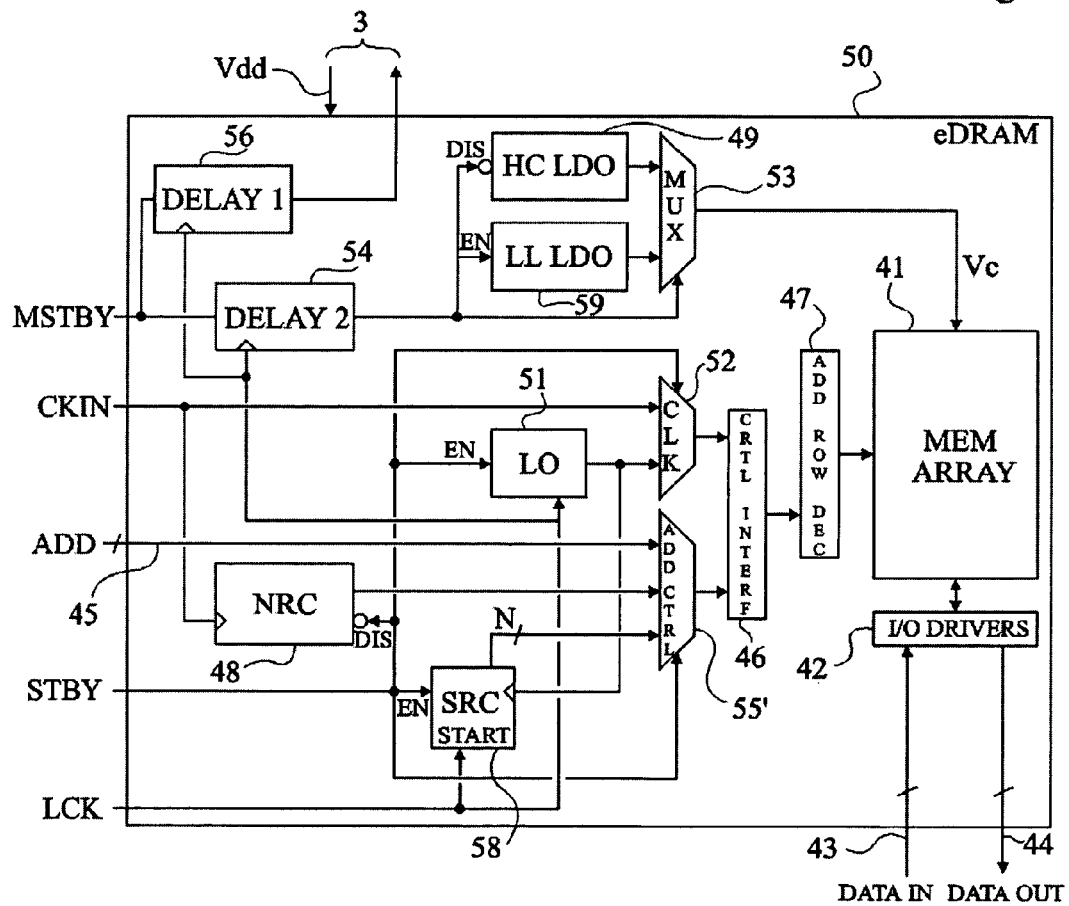
FIG. 5 partially and schematically shows in the form of blocks an embodiment of a DRAM according to the present invention.

FIG. 5 shows an embodiment of a DRAM circuit 50 (eDRAM) according to the present invention.

As previously, circuit 50 comprises an array network 41 of memory cells (MEM ARRAY) connected by input/output circuits 42 (I/O DRIVERS) to a data input bus 43 (DATA IN) and to a data output bus 44 (DATA OUT). The cells of network 41 are selected by an address decoder 47 (ADD ROW DEC) controlled by a control interface circuit 46 (CTRL INTERF). Circuit 50 also comprises a first refreshment controller 48 (NRC) controlled by a clock CKIN coming from the outside, an address bus input 45 (ADD) from the outside, and a first linear regulator 49 (HC LDO) receiving a supply voltage Vdd from the outside.

According to this embodiment of the present invention, a second refreshment circuit 58 (SRC) intended to operate in standby periods of the system provides addresses to a multiplexer 55' (ADD CTRL) forming an address selector and having two other inputs respectively receiving the addresses provided by first refreshment circuit 48 and by external address bus 45. The output of selector 55' is sent to circuit 46.

Further, circuit 50 comprises a local oscillator 51 (LO) in charge of providing a clock in standby periods. The output of local oscillator 51 is connected to a first input of a multiplexer 52 of selection between this output and signal CKIN from the outside, the output of multiplexer 52 providing the clock signal to control interface 46. Local oscillator 51 receives, as a clock frequency, a second signal LCK coming from the outside, having a frequency lower than the frequency of clock CKIN.

In the application to telephony, signal LCK is generated by a dedicated circuit comprised by the terminal and its frequency corresponds to the frequency of synchronization of the events of the GSM network (32.768 kHz). Clock CKIN originates from a phase-locked loop (PLL) of the telephony circuit (1', FIG. 3) generating frequencies of several tens of MHz intended for the digital circuits.

In the preferred embodiment of FIG. 5, a second voltage regulator 59 (LL LDO) is intended to supply memory 41 in standby periods with a voltage smaller than the voltage regulated by first regulator 49, to reduce its power consumption.

The respective outputs of regulators 49 and 59 are connected to the inputs of a multiplexer 53 having its output providing voltage Vc at least to the common electrode of the cells of memory plane 41. Both regulators 49 and 59 receive external voltage Vdd.

These regulators are controlled by a signal MSTBY resulting from a general setting to standby of the telephony circuit (originating from microprocessor 12, FIG. 3). Two delay elements 54 (DELAY2) and 56 (DELAY1), the function of which will be discussed in relation with FIG. 6, respectively delay the selection of regulator 59 and the reactivation of the general supply circuit (block 3, FIG. 1).

Second refreshment controller 58 is started by the setting to standby of signal processor 21 (signal STBY). As an alternative and especially in the absence of a signal processor in the telephony circuit, signal STBY will come from the setting to standby of microprocessor 12. In this case, signals STBY and MSTBY will have to be shifted in time as will appear from the description of FIG. 6. The time shift will be used to check that the memory has effectively entered the low-power consumption refreshment mode before switching signal MSTBY.

Signal STBY in the active state (standby) activates local oscillator 51 and second refreshment controller 58 while it deactivates normal refreshment controller 48. Further, signal STBY in the active state selects the output of oscillator 51 in clock multiplexer 52 and the third input (coming from controller 58) of address controller 55'.

Figure 6:
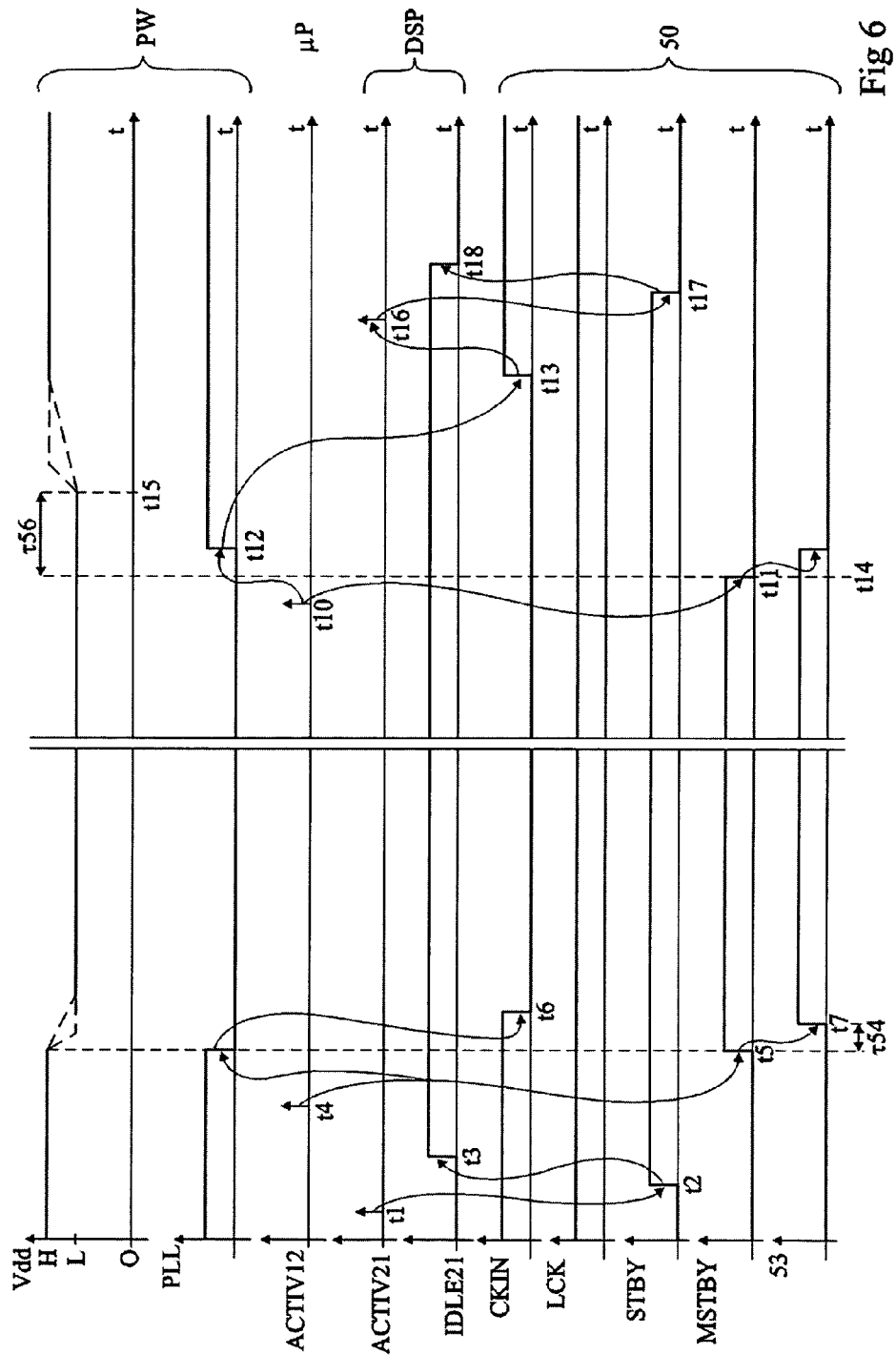
FIG. 6 shows timing diagrams illustrating the operation of the DRAM of FIG. 5.

FIG. 6 shows examples of the shape of different signals of the circuit of FIG. 5 in a setting to standby of the telephony circuit (left-hand portion of the drawing), then in a reactivation (right-hand portion of the drawing). These timing diagrams respectively show the shape of supply voltage Vdd provided by the circuit of the GSM terminal (block 3, FIG. 1), the active or inactive state of a PLL circuit (clock phase-locked loop) of processor 12, the indication (ACTIV12) of end-of-task or waking times of processor 12, the indication (ACTIV21) of end-of-task or waking times of processor 21, a signal IDLE21 indicative of the switching to a low-power consumption state of processor 21, the present or absent state of clock signal CKIN, the state (always present) of signal LCK provided by the clock circuit of the terminal generating the fixed 32.768-kHz frequency, the state of signal STBY of setting to standby of signal processor 21, the state of signal MSTBY of setting to standby generated by microprocessor 12, and the state of the selection signal of supply multiplexer 53.

In normal operation, the supply voltage is at a relatively high level H, the PLL is active, signal IDLE21 is inactive, external clock CKIN is present, signals STBY and MSTBY are in the low state, and signal 53 is in the low state indicating a selection of first regulator 49. The DRAM then conventionally operates by a refreshment by means of controller 48 controlled by clock CKIN.

An end-of-task of signal processor 21 is assumed at a time t1. This end-of-task is symbolized by an edge on signal ACTIV21. After this end-of-task, signal STBY switches high (time t2), which causes a state switching of signal IDLE21 indicative of a standby state of the digital processor (time t3). At this time t3, refreshment controller 48 is deactivated while refreshment processor 58 and oscillator 51 are activated and multiplexers 52 and 55' respectively select a clock signal provided by local oscillator 51 and the output of controller 58 for the generated refreshment addresses. Supply voltage Vc remains provided by regulator 49.

In a first embodiment more specifically intended for memories of relatively small size (typically up to 1 Megabit), controller 58 generates a refreshment instruction like a normal controller. This generation is synchronized by clock signal LCK which is provided on an input (START) for starting controller 58.

In a second embodiment more specifically intended for memories of greater capacity (several Megabits), generator 58 generates, at each clock cycle LCK, N addresses intended for controller 55' to sequentially address several cells of the memory plane. Number N of refreshment instructions depends on the retention time of the memory cells. This number may be controlled by the circuit temperature which also conditions this retention time.

It is assumed that microprocessor 12 ends its task at a time t4 slightly subsequent to time t1. This end-of-task is symbolized by an edge on signal ACTIV12 and causes the state switching of signal MSTBY at a slightly subsequent time t5, as well as the stopping of the PLL. The stopping of this PLL causes the disappearing of signal CKIN (time t6) and circuit 50 then only receives signal LCK at a relatively low frequency. Microprocessor 12 checks that signal IDLE21 is active, indicating that element 40 operates at the low refreshment frequency, before generating signal MSTBY.

From time t5, the entire circuit is synchronized by clock LCK.

According to the preferred embodiment of the present invention, the switching to the high state of signal MSTBY triggers delay element 54 which provides the state switching to multiplexer 53 after a delay τ54 (time t7). Thus, at time t7 of expiry of delay τ54, regulator 49 is deactivated while regulator 59 is activated. The use of a second regulator dedicated to the standby enables further reducing the system power consumption.

Regulator 49 is intended to provide a relatively high current for the high-frequency operation of the circuit in normal mode. When the frequency is reduced to the standby mode refreshment frequency (32 kHz), the required amount of power is smaller. Accordingly, while regulator 49 must be fast to adapt to the surge current variations of the memory plane according to the states of the cells addressed at frequency CKIN and provide a significant current due to the volume of addressed cells per time unit, regulator 59 can be relatively slow (as compared to regulator 49) due to the low refreshment frequency (ratio of approximately 1,000 with respect to frequency CKIN), which results in lesser current variations. This enables using a regulator with a high output impedance to minimize leakages.

At time t5, the cutting of the PLL comes along with a decrease in the supply voltage provided by the external circuit (3, FIG. 1). This decrease is performed down to a level L (for example, on the order of 0.95 volt). When the voltage is at the low level, it is preferable to use low-leakage regulator 59. The use of a fixed delay τ54 may be replaced with a measurement of the supply voltage to start regulator 59 dedicated to standby. It should be noted that the time when voltage Vdd becomes low may not be known with certainty since it depends on the accumulated charges and on elements external to the circuit, which has been illustrated in dotted lines for the transition between levels H and L in the first timing diagram.

The telephony circuit then is at standby. The DRAM is refreshed with a minimum power consumption compatible with current aims of mobile phone battery lasting.

This operation is compatible with the rest of the operation of the telephony circuit in which, at standby, only dedicated logic circuits remain activated by being synchronized on clock LCK at the frequency used to synchronize the events of the GSM network.

Signal LCK and the relatively low power supply (for example, 0.95 volt) are present as soon as the terminal (the mobile phone) is powered on. The content of the DRAMs specific to the present invention is preserved as long as the terminal is supplied.

A waking up of the activity by the logic circuits is assumed at a time t10, symbolized by an edge on signal ACTIV12 of the microprocessor. This activation causes the reactivation (time t12) of the PLL and the reactivation of the power supply circuit to the high level. After its starting, the PLL takes some time to provide signal CKIN (time t13). The waking of microprocessor 12 also causes the state switching of signal MSTBY (time t11) which switches the voltage regulators (time t14, signal 53). In this direction, delay element 54 is not active. However, this element being synchronized by signal LCK, time t14 is synchronous with clock LCK.

The state switching of signal MSTBY starts delay element 56 which, after a delay τ56, provides a reactivation signal to power supply circuit 3. Delay τ56 is selected to be greater than the time required for the switching of the regulators internal to circuit 50.

At the end of delay τ56 (time t15), the supply circuit starts increasing voltage Vdd. As for its decrease, the transition time is unknown (illustrated by a dotted line in the first timing diagram).

As long as signal STBY remains high, the DRAM refreshment remains ensured on the basis of clock LCK as in the standby mode.

Digital signal processor 21 can only start once clock signal CKIN is present. At time t13 when clock CKIN appears, processor 21 is reactivated (edge at time t16 on signal ACTIV21). This activation causes the state switching of signal STBY (time t17) which in turn switches signal IDLE21 (time t18).

From time t17, controller 58 is deactivated, as well as local oscillator 51. Refreshment controller 48 is reactivated and multiplexers 52 and 55' respectively select input CKIN and one of their inputs from among the external address input and the output of controller 48. The selection from among the two inputs remaining available on controller 55' is then conventional.

Preferably, relay elements 54 and 56 are programmable so that on switching to standby, element 56 is inactive while element 54 provides a delay, for example, by two periods of signal LCK. On switching to the normal mode, the opposite occurs, element 56 providing a delay, for example, by two periods, while element 54 is deactivated. The adaptation of delays τ54 and τ56 depends on the times of switching and of establishing of the external power supplies and the power supplies generated by regulators 49 and 59.

In a simplified embodiment, a single regulator 59 is used. Signal MSTBY then is not useful for circuit 50.

An advantage of the present invention is that it enables use of a DRAM with a low external frequency while ensuring a proper operation when access to this memory is needed.

Another advantage of the present invention is that it reduces the DRAM power consumption in its standby mode and it is compatible with a decrease of the supply voltage level.

Another advantage of the present invention is that the use of the clock signal currently used to synchronize the terminal events on the GSM network events in the application to mobile telephony ensures a synchronization of the elements and especially of the switchings between regulators due to the supply voltage switchings, thus avoiding any power supply conflict risk.

Another advantage of the present invention is that it requires no modification of the memory cell array network, of input-output circuits 42, of address decoders 47, and of control interface circuit 46.

Of course, the present invention is likely to have various alterations, modifications, and improvements which will readily occur to those skilled in the art. In particular, the use of a paged memory to perform several simultaneous accesses on refreshment is within the abilities of those skilled in the art using techniques known per se. Further, the practical implementation of the DRAM based on the functional indications given hereabove is within the abilities of those skilled in the art. Further, although the present invention has been more specifically described in relation with an application to mobile telephony, it more generally applies as soon as two external clock signals of different frequencies are available and as it is desired to switch from a normal operating mode to a standby mode.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for controlling a DRAM in a mobile telephone or cellular terminal apparatus, the circuit comprising:
    a first refreshment controller controlled by a first clock signal having a first frequency; and
    a second refreshment controller controlled by a second clock signal generated by the mobile telephone or cellular terminal apparatus, a second frequency of the second clock signal being a synchronization frequency of a mobile telephone network protocol.

2. The circuit of claim 1, wherein the first refreshment circuit is activated in a normal operation mode and the second refreshment circuit is activated in a standby mode of the circuit.

3. The circuit of claim 2, wherein the second frequency synchronizes a switching between the normal operation mode and the standby mode.

4. The circuit of claim 3, comprising at least two voltage regulators respectively dedicated to the normal operation mode and the standby mode.

5. The circuit of claim 1, further comprising the DRAM.

6. A mobile telephony circuit comprising at least one microprocessor, peripherals and modems associated with the at least one microprocessor, and the circuit of claim 5.

7. A mobile telephone or cellular terminal apparatus, comprising:
    at least one microprocessor;
    at least one modem associated with the at least one microprocessor for communicating with a GSM network;
    a DRAM; and
    a circuit for controlling the DRAM, the circuit comprising:
    a first refreshment controller controlled by a first clock signal having a first frequency; and
    a second refreshment controller controlled by a second clock signal having a second frequency lower than the first frequency;
    wherein the second frequency corresponds to a synchronization frequency of the GSM network.

8. The circuit of claim 6, further comprising a signal processor.

9. The circuit of claim 8, wherein the signal processor is associated with a second DRAM.

10. A mobile phone comprising the telephony circuit of claim 6.

11. A method for controlling a DRAM in a mobile telephone or cellular terminal apparatus, the method comprising:
    refreshing the DRAM during a first operating mode with a first clock signal having a first frequency;
    receiving from the mobile telephone or cellular terminal apparatus a second clock signal having a second frequency, the second frequency being a synchronization frequency of a mobile telephone network protocol; and
    refreshing the DRAM during a second operating mode with the second clock signal.

* * * * *